US011357111B2

(12) United States Patent
Asikkala et al.

(10) Patent No.: US 11,357,111 B2
(45) Date of Patent: Jun. 7, 2022

(54) METHOD FOR MANUFACTURING A MULTILAYER STRUCTURE WITH EMBEDDED FUNCTIONALITIES AND RELATED MULTILAYER STRUCTURE

(71) Applicant: TactoTek Oy, Oulunsalo (FI)

(72) Inventors: Janne Asikkala, Oulunsalo (FI); Tomi Simula, Oulunsalo (FI); Antti Keränen, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 3 days.

(21) Appl. No.: 16/113,388

(22) Filed: Aug. 27, 2018

(65) Prior Publication Data

US 2020/0068714 A1 Feb. 27, 2020

(51) Int. Cl.
*H05K 3/46* (2006.01)
*H01L 23/485* (2006.01)
(Continued)

(52) U.S. Cl.
CPC ......... *H05K 1/186* (2013.01); *H01L 23/4985* (2013.01); *H01L 23/49822* (2013.01);
(Continued)

(58) Field of Classification Search
CPC ....... H01L 23/28–3192; H01L 25/0655; H01L 25/072; H01L 21/56; H01L 21/561; H01L 21/565; H01L 21/566; H01L 23/498; H01L 23/49822; H01L 23/4985; H01L 23/52–5389; H05K 1/09; H05K 1/092;
(Continued)

(56) References Cited

U.S. PATENT DOCUMENTS 5,622,652 A * 4/1997 Kucherovsky ......... G01V 15/00
106/1.18
7,494,557 B1 * 2/2009 Peterson .............. H05K 1/0272
264/43

(Continued)

OTHER PUBLICATIONS

International Search Report issued by the European Patent Office acting as the International Searching Authority in relation to International Application No. PCT/FI2019/050600 dated Dec. 2, 2019 (4 pages).

(Continued)

*Primary Examiner* — Bryan R Junge
(74) *Attorney, Agent, or Firm* — Robert P. Michal, Esq.; Carter, DeLuca & Farrell LLP

(57) ABSTRACT

A method for manufacturing an integrated multilayer structure includes obtaining a substrate film having first and second sides, providing at least on the first side one or more first functional features, arranging at least one layer upon at least the first side; removing, at least a portion of the substrate film so that space is released in the structure wherein a detachment-enhancing feature provided to the substrate film is configured to facilitate the removal of the at least a portion of the substrate film such that the adjacent remaining film material, if any, the arranged layer and the one or more first functional features are preserved and preferably remain substantially intact; and providing at least one second functional feature into the space released for use so that the at least one second functional feature operatively connects with at least one of the one or more first functional features.

12 Claims, 3 Drawing Sheets

(51) Int. Cl.
- *H01L 23/498* (2006.01)
- *H05K 1/18* (2006.01)
- *H05K 3/00* (2006.01)
- *H05K 3/12* (2006.01)
- *H05K 3/10* (2006.01)
- *H01R 13/405* (2006.01)
- *H05K 1/02* (2006.01)

(52) U.S. Cl.
CPC .......... *H05K 3/0014* (2013.01); *H05K 3/107* (2013.01); *H05K 3/12* (2013.01); *H05K 3/4697* (2013.01); *H01R 13/405* (2013.01); *H05K 1/0266* (2013.01); *H05K 1/0274* (2013.01); *H05K 2201/0108* (2013.01); *H05K 2201/09936* (2013.01); *H05K 2203/0264* (2013.01); *H05K 2203/1316* (2013.01); *H05K 2203/166* (2013.01)

(58) Field of Classification Search
CPC .......... H05K 1/18–189; H05K 3/0014; H05K 3/4697; H05K 2201/09127; H05K 2203/308; H05K 3/4632; H05K 2201/0129; H05K 3/1241; H05K 3/125; H05K 3/4664; H05K 3/107
See application file for complete search history.

(56) References Cited

U.S. PATENT DOCUMENTS

| | | | | |
|---|---|---|---|---|
| 9,997,442 | B1* | 6/2018 | Lin | H05K 3/4697 |
| 10,165,689 | B1* | 12/2018 | Atwood | H05K 3/0058 |
| 2006/0225275 | A1* | 10/2006 | Yang | H05K 3/4614 |
| | | | | 29/852 |
| 2008/0102410 | A1* | 5/2008 | Kim | H01L 23/49822 |
| | | | | 430/312 |
| 2009/0183829 | A1* | 7/2009 | Rendek,, Jr. | H05K 3/0014 |
| | | | | 156/285 |
| 2010/0025087 | A1* | 2/2010 | Takahashi | H05K 1/183 |
| | | | | 174/254 |
| 2010/0155103 | A1* | 6/2010 | Kamikoriyama | C09D 11/38 |
| | | | | 174/126.1 |
| 2012/0000695 | A1* | 1/2012 | Chisaka | H05K 1/0271 |
| | | | | 174/251 |
| 2012/0160803 | A1* | 6/2012 | Cai | H05K 1/183 |
| | | | | 216/20 |
| 2013/0020120 | A1* | 1/2013 | Ishihara | H05K 1/183 |
| | | | | 174/262 |
| 2014/0054080 | A1* | 2/2014 | Sato | H05K 3/4602 |
| | | | | 174/266 |
| 2014/0083744 | A1* | 3/2014 | Hu | H01L 21/4857 |
| | | | | 174/251 |
| 2015/0156880 | A1* | 6/2015 | Daizo | H05K 1/183 |
| | | | | 174/251 |
| 2017/0094800 | A1 | 3/2017 | Keranen et al. | |
| 2017/0142828 | A1* | 5/2017 | Yu | H05K 1/0298 |
| 2017/0164468 | A1* | 6/2017 | Chang | H05K 3/4697 |
| 2017/0372980 | A1* | 12/2017 | Kurahashi | H05K 3/4602 |
| 2018/0005945 | A1* | 1/2018 | Pietambaram | H01L 24/17 |
| 2018/0242456 | A1* | 8/2018 | Gottwald | H05K 1/185 |
| 2019/0059151 | A1* | 2/2019 | Burns, IV | H05K 1/028 |

OTHER PUBLICATIONS

The Written Opinion of the International Searching Authority issued by the European Patent Office acting as the International Searching Authority in relation to International Application No. PCT/FI2019/050600 dated Dec. 2, 2019 (6 pages).

* cited by examiner

METHOD FOR MANUFACTURING A MULTILAYER STRUCTURE WITH EMBEDDED FUNCTIONALITIES AND RELATED MULTILAYER STRUCTURE

FIELD OF THE INVENTION

Generally the present invention relates to electronics, associated devices, structures and methods of manufacture. In particular, however not exclusively, the present invention concerns manufacturing of multilayer structures containing multiple functional features.

BACKGROUND

There exists a variety of different stacked assemblies and structures in the context of electronics and electronic products.

The motivation behind the integration of electronics and related products may be as diverse as the related use contexts. Relatively often size savings, weight savings, cost savings, or just efficient integration of components is sought for when the resulting solution ultimately exhibits a multilayer nature. In turn, the associated use scenarios may relate to product packages or food casings, visual design of device housings, wearable electronics, personal electronic devices, displays, detectors or sensors, vehicle interiors and vehicle electronics, antennae, labels, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, lithography and inkjet printing, through a substantially additive printing process. The used substrates may be flexible and printed materials organic, which is however, not always the case.

The concept of injection molded structural electronics (IMSE) actually involves building functional devices and parts therefor in the form of a multilayer structure, which encapsulates electronic functionality and possibly other functionality.

In an IMSE process different features of desired function may be first applied to at least one substrate film. Then the one or more films may be inserted in an injection molding cavity, where hot melt state material is injected upon the film or between the films, thus becoming an integral part of the resulting multilayer structure.

One interesting characteristic of IMSE is also that the electronics is often, not always, manufactured into a 3D (non-planar) form in accordance with the 3D models of the overall target product, part or generally design. To achieve desired layout of electronic or other elements on a substrate and in the associated end product, the electronics may be still provided on an initially planar substrate, such as a film, using two dimensional (2D) methods of electronics assembly, whereupon the substrate, already accommodating the electronics, may be optionally subsequently formed into a desired three-dimensional, i.e. 3D, shape and subjected to overmolding, for example, by suitable plastic material that covers and embeds the underlying elements such as electronics, thus protecting and potentially also hiding the elements from the environment.

When a multilayer structure is loaded with various electronics, it may not always function completely in isolation, i.e. autonomously. Instead, various power, data and/or control connections may have to be provided thereto, which typically requires provision of e.g. electrical connectors and related wiring.

In some cases, when one or more functional elements, such as electronic, optical or optoelectronic components, were to be included in a multilayer structure, their integration has turned out difficult during actual stacking of the layers by e.g. molding or lamination, as the target configuration in terms of e.g. desired layer shapes, dimensions, element positioning and alignment, both generally and mutually, has been tricky to achieve using the contemporary methods. Yet, some of the functional elements to be provided in the structure have been found sensitive to a number of phenomena such as pressure or temperature subjected to them during the stack-up or e.g. specifically molding process, or e.g. 3D forming process, which has rendered their early insertion in the structure challenging if not impossible due to an associated high risk of breakage while connecting, fabricating, or forming the layers.

In some occasions measures trying to integrate all functional features in desired target locations within a multilayer structure to be constructed already while sandwiching the layers has generally resulted in tedious, complex and slow, manufacturing processes with potentially low yield, whereupon unique alternative techniques for providing functional features in a multilayer structure have raised considerable interest.

Further, in some scenarios a need to lock down the internals and functionalities of the multilayer structure already upon construction or integration of the layers has been found limiting from the standpoint of different uses some more generally applicable structure could ultimately find.

SUMMARY

The objective of the present invention is to at least alleviate one or more of the above drawbacks associated with the existing solutions in the context of integral multilayer structures and functional elements or features such as electronics embedded therein.

The objective is achieved with various embodiments of a method for manufacturing an integrated multilayer structure and related multilayer structures in accordance with the present invention.

According to one embodiment of the present invention, a method for manufacturing an integrated multilayer structure, comprises:

obtaining a substrate film of selected material and having a first and second side, said substrate film optionally being flexible and/or comprising plastic and/or composite material;

providing at least on the first side of the substrate film one or more first functional features, optionally including decorative, informative, other optical, protective, electrical and/or or electronic features such as conductors and/or electronic components;

arranging at least one layer, preferably at least partially comprising electrically substantially insulating and/or conductive material, optionally plastic material, upon at least the first side of the substrate film;

removing, optionally selectively and locally, at least a portion of the substrate film so that space, optionally comprising a through-hole in the substrate film, is released in the structure, wherein a detachment-enhancing feature provided to the substrate film is configured to facilitate the removal of said at least portion such that the adjacent remaining film material, if any, the arranged layer and the first functional features are preserved and preferably remain substantially intact; and providing at least one second functional feature into the space released for use so that the at least one second functional feature at least functionally, preferably optically, electrically and/or electromagnetically, connects with at least one of said one or more first functional features.

According to one other embodiment, an integrated multilayer structure, comprises:

a substrate film having a first and second side, said substrate film optionally being flexible and/or comprising plastic material, one or more first functional features provided at least upon the first side of the substrate film, optionally including decorative, informative, other optical, electrical and/or electronic features such as conductors and/or electronic components;

at least one layer, optionally comprising or consisting of plastic material, arranged, optionally molded, upon at least the first side of the substrate film; and a detachment-enhancing feature provided relative to at least a portion of the substrate film to facilitate the removal of the at least portion such that the adjacent film material, if any, the arranged layer and the first functional features remain substantially intact during the removal, while space, optionally defining a through-hole in the film, is released in the structure to enable at least partially filling the space with one or more second functional features preferably having a functional connection with the one or more first functional features.

According to a further embodiment, an integrated multilayer structure comprises:

a substrate film having a first and second side, said substrate film optionally being flexible and/or comprising plastic and/or organic material, one or more first functional features provided at least upon the first side of the substrate film, optionally including decorative, informative, other optical, electrical and/or electronic features such as conductors and/or electronic components;

at least one layer, optionally plastic material, arranged, optionally molded, upon the first side of the substrate film, wherein space, such as a hole or cavity, is defined in the structure, comprising a through-hole in the film, preferably obtained by locally removing at least a portion of the substrate film; and at least one second functional feature provided into the space so that it at least functionally, preferably electrically or electromagnetically, connects with one or more of the first functional features.

Still according to a further embodiment, an integrated multilayer structure comprises:

at least one material layer, optionally of molded plastic material, one or more first functional features provided to the at least one material layer by a substrate film, optionally including decorative, informative, other optical, electrical and/or electronic features such as conductors and/or electronic components, said one or more first functional features optionally defining a hole; and at least one second functional feature preferably at least partially provided into the hole so that it at least functionally, preferably electrically or electromagnetically, connects with one or more of the first functional features.

Various considerations provided herein concerning the embodiments of the multilayer structure may be flexibly applied to the embodiments of a manufacturing method mutatis mutandis, and vice versa, as being appreciated by a skilled person. Yet, various embodiments and related features may be flexibly combined by a person skilled in the art to come up with preferred combinations of features generally disclosed herein.

The utility of the present invention arises from a plurality of issues depending on the embodiment.

Generally, it is made possible, by the suggested selective delamination or complete removal of a substrate film, to add one or more new functional features, including but not limited to optics, haptics, electronics, etc., by means of attaching or directly producing the associated elements in the multilayer structure subsequent to construction of the multilayer structure already containing the film and a number of features as well as a molded or casted layer provided thereon. Alternatively or additionally, various embodiments of the present invention similarly enable convenient establishing of an external connection such as electrical, mechanical, or optical connection to the structure internals. Space for accommodating the added features may be released, i.e. established and/or revealed, for instance, by the use of different applicable detachment-enhancing measures in the structure as well as by at least selective removal of the substrate film from the structure. The added features may at least functionally connect with one or more other features already present in structure. Accordingly, new functionalities may be dynamically and flexibly added to and embedded in the multilayer structure that has been at least partially constructed earlier.

Also thermal management, or specifically heat management, of the overall structure or particular features provided therein may be enhanced by various embodiments of the present invention as applicable heat conducting material features (solid elements, gaseous matter, etc.) may be supplied to the structure and e.g. into contact with internals thereof via the released space. Certain features such as high power LEDs (associated power could be in the magnitude of about one or several, even tens of, watts, for instance) cannot be usually straightforwardly in-molded e.g. in plastic or some other material provided upon the substrate film due to high heat generation during their operation. By various embodiments of the present invention, also such LEDs or other high power/heat generating elements may be provided in the multilayer structure so that their heat conduction can still be satisfactorily managed, using e.g. separate housing and/or enhanced heat transfer.

As a practical example having regard to provision of one or more connectors as added functional features, in some embodiments, an electrical or other connector structure, or simply a connector, for providing electrical, e.g. power and/or communications, connection between the internal, embedded features of the multilayer structure and an external device, system or structure may be reliably and also with good visual quality integrated, secured and embedded within a functional, e.g. circuit design and various electronics-containing multilayer structure generally manufactured in accordance with e.g. IMSE principles. Potentially problematic later piercing of the substrate film or application of other methods requiring proceeding through the film material either by the connector itself or by e.g. a specific hole-making tool may be therefore avoided when preferred.

As a further practical example, good adhesion of a substrate film to adjacent elements or layers is commonly highly preferable in insert molding and specifically e.g. in the field of IMSE. However, by embodiments of the present invention selective (on selected areas) or complete delamination of the film may be exploited to connect or add additional functional features to IMSE, which could not be done easily or at all using e.g. one-shot molding. When delamination is achieved so that e.g. electrical conductors or other features remain attached to the side of molded plastics while the substrate film is removed on at least selected areas additional features can be flexibly and conveniently post assembled to the already established multilayer structures. Additional features can be for example light-emitting components such as LEDs, pressure sensors, capacitive sensors, haptic features such as touch detection sensors, etc.

Still further, features requiring precise positioning or e.g. alignment with other elements may benefit from the present invention. For example, LEDs or other light sources may have to be aligned with other functional or specifically optical features such as a lens, reflector, prism, or lightguide provided in the multilayer structure, which was traditionally considered difficult due to inaccuracies caused to the positioning and alignment of the mutually aligned features by resolution and related constraints set by used manufacturing techniques such as molding/lamination of layers. Now, final positioning or alignment may be done after inaccuracy-causing manufacturing phases.

Further, in some embodiments, advantageous combinations of soft (deformable), e.g. elastic, and essentially rigid or stiff materials may be come up with. Accordingly, functionalities such as combined pressure sensor—capacitive button may be created. For instance, conductive soft material or generally soft functional feature can be injection molded or otherwise provided in the structure using e.g. a second molding shot following the first shot used to produce the harder and/or stiffer material on the film and removal of film. In some embodiments, soft material may be attached to the structure via or in the removed portion e.g. by adhesive. In other words, structure and function combining arrangements not practically feasible earlier may be obtained.

In the above and other use scenarios it is commonly considered beneficial to introduce the substrate film at least locally with one or more detachment-enhancing features so that the film, or in some embodiments films, can be separated from one or more features originally provided on the film, e.g. graphic print, conductive or otherwise functional ink, so that the features remain adhered to e.g. injection molded resin or other layer provided on the film while the film is at least selectively removed. In the space made available due to at least local removal of the film, the exposed internals such as functional features may be subjected to post processing and the space may be filled with additional functionality that preferably at least operably connects with the existing functionalities. Among other options, the detachment-enhancing feature may include e.g. a protective layer or feature provided on a film surface. The protective layer or similar feature may be chosen so that it has relatively poor (or at least poorer) adhesion to other neighboring materials such as molded material or e.g. graphic and functional ink, whereupon it can be peeled off or otherwise extracted preferably together with the matching portion of the substrate after the provision of the resin or other layer.

Different embodiments of a manufacturing method suggested herein are still somewhat straightforward to comprehend and take into use, and what is considered beneficial, do not necessitate adopting completely new or different manufacturing technologies just for adding the desired functionality in the multilayer structure. Forming of the film(s) to a desired 3D shape e.g. after provision of features such as conductors or further electronics thereon (while the substrate film was still substantially planar), may additionally reduce or obviate a need for potentially tedious and error prone 3D assembly of electronics on a substrate. By the embodiments of the present invention, functional elements, e.g. various electronics, optics, or e.g. (piezo) haptics, which are sensitive to forces or other implications arising from 3D forming or other phases of establishing the multilayer structure (e.g. molding or casting-induced heat or pressure), may be cleverly provided in the structure afterwards.

The obtained multilayer structure may be used to establish a desired device or module in different host elements such as vehicles or specifically (in-)vehicle electronics, lighting devices including vehicle lighting, user interfaces in vehicles and elsewhere, dashboard electronics, in-vehicle entertainment devices and systems, vehicle interior or exterior panels, intelligent garment (e.g. shirt, jacket, or trousers, or e.g. a compression garment), other piece of wearable electronics (e.g. wristop device, headwear, or footwear), personal communications devices (e.g. smartphone, phablet or tablet) and other electronics. The integration level of the obtained structure may be high and desired dimensions such as the thickness thereof small.

The used film(s) and generally material layers may contain graphics and other visually and/or tactilely detectable features thereon, whereupon the films/layers may have aesthetic (decorative) and/or informative function in addition to hosting and protecting the electronics. The film(s)/layer(s) may be translucent or opaque at least in places. They may exhibit a desired color or comprise portions exhibiting a desired color to the corresponding portions of the structure. The obtained multilayer structure may thus incorporate one or more color/colored layers that optionally determine graphics such as text, pictures, symbols, patterns, etc. These layers may be implemented by dedicated films of certain color(s), for instance, or provided as coatings (e.g. through printing) on existing film(s), molded layer(s), and/or other surfaces. Exterior film(s) of the multilayer structure may be configured to establish at least a portion of outer and/or inner surface of the associated host product or host structure.

Various visible or visual features such as graphical patterns or coloring may be provided underneath the exterior surface of the structure so that the features remain isolated and thus protected from environmental effects at least by the thickness of the hosting substrate films and optionally of the molded layer depending on which side the film was provided relative to the environmental threat. Accordingly, different impacts, rubbing, chemicals, etc. that could easily damage e.g. painted, printed or mounted surface features do not affect or reach the features. The material layers such as the ones defined by substrate or other films may be easily manufactured or processed, optionally cut, into a desired shape with necessary characteristics such as holes or notches for exposing the underlying features such as the molded material.

The expression "a number of" may herein refer to any positive integer starting from one (1).

The expression "a plurality of" may refer to any positive integer starting from two (2), respectively.

The terms "first" and "second" are herein used to distinguish one element from other element, and not to specially prioritize or order them, if not otherwise explicitly stated.

When "different" or "various" embodiments of the multilayer structure, related method of manufacture, or features included therein are referred to herein, the embodiments are to be considered mutually supplementary and may thus be realized in common embodiments, unless being otherwise explicitly stated or otherwise clear to a person skilled in the art that the concerned solutions are mutually clearly exclusive alternative solutions for implementing the very same feature of the solution.

Different embodiments of the present invention are disclosed in the attached dependent claims.

BRIEF DESCRIPTION OF THE DRAWINGS

Next the present invention will be described in greater detail with reference to the accompanying drawings, in which.

DETAILED DESCRIPTION

Figure 1:
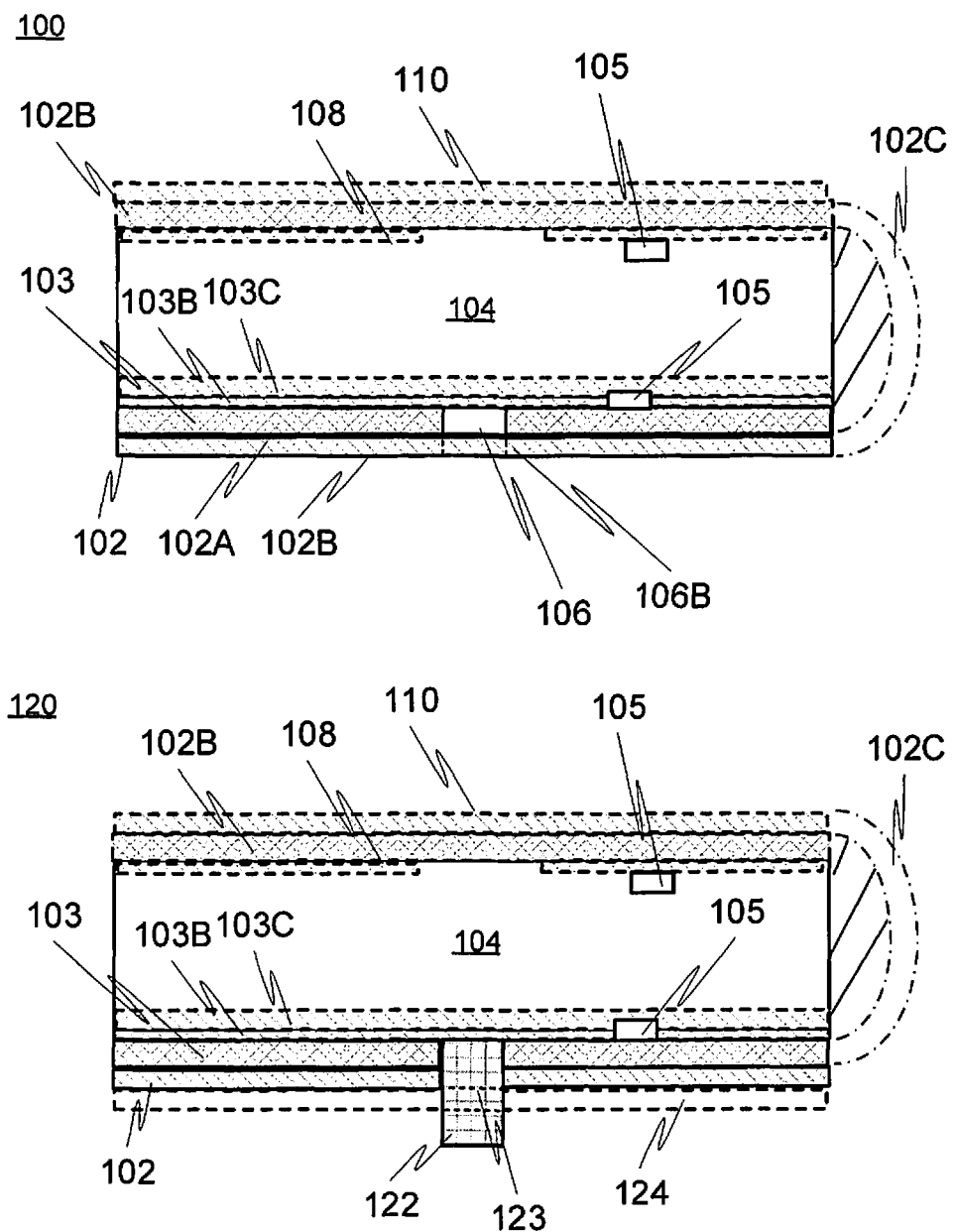
FIG. 1 illustrates two embodiments of a multilayer structure in accordance with the present invention, also representing two different stages of a combined potential overall process.

FIG. 1 illustrates, via a (cross-sectional) side view, an embodiment 100 of a multilayer structure in accordance with the present invention. Another embodiment 120 is shown as well, which may be obtained from the embodiment 100 after removal of material therefrom and provision of at least one functional feature at least partially in the released space.

The multilayer structure 100 may establish an end product per se, e.g. an electronic device, or be disposed in or at least connected to a host device, host system or host structure as an aggregate part or module, for example. It 100 may comprise a number of other elements or layers not explicitly shown in the figure for clarity reasons.

The structure 100 contains at least one substrate film 102 with two, essentially opposing sides 102A, 102B.

In various embodiments, the substrate film(s) 102 may generally comprise or consist of one or more material(s) such as plastics, e.g. thermoplastic polymer, and/or organic or biomaterials with reference to e.g. wood, paper, cardboard, leather or fabric, or a combination of any of these materials with each other or with plastics or polymers or metals. The substrate film 102 may generally comprise or essentially consist of thermoplastic material. The film 102 may contain composite material. The film 102 may comprise a coating on either side thereof. The film 102 may be essentially flexible or bendable, at least in places. In some embodiments, the film 102 may alternatively be substantially rigid and stiff. The thickness of the film 102 may vary depending on the embodiment; it may only be of few tens or hundreds of a millimeter, or considerably thicker, in the magnitude of one or few millimeter(s), for example.

The film 102 may be of constant or varying thickness and/or generally construction. Based on the foregoing, the substrate film 102 may, for example, comprise at least one material selected from the group consisting of: polymer, thermoplastic material, electrically insulating material, electrically conductive material, PMMA (Polymethyl methacrylate), Poly Carbonate (PC), copolyester, copolyester resin, polyimide, a copolymer of Methyl Methacrylate and Styrene (MS resin), glass, Polyethylene Terephthalate (PET), carbon fiber, composite material, organic material, biomaterial, leather, wood, cellulose, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

Item 104 refers to at least one layer provided upon the film 102. The layer 104 may have been produced onto to film 102 by molding, such as injection molding, or casting such as dipping, for instance, of the associated material(s). Alternatively or additionally, layer 104 may have been arranged onto the film 102 through laminating it e.g. as ready-made element onto the film 102 utilizing e.g. mechanical bonding, chemical bonding, electrical bonding, electrical bonding, heat, pressure, solvent and/or adhesive.

The layer 104 arranged onto the film 102 may generally comprise a number of materials such as polymer, organic, biomaterial, composite material as well as any combination thereof. The material may comprise thermoplastic and/or thermosetting material(s). Thickness of the included layer(s) and other features, and thus of the overall structure 100, may vary depending on the embodiment. It may be, for example, in the order of magnitude of one, few or tens of millimeters. The material may be e.g. electrically insulating or conductive. In some embodiments, the layer 104 may, for example, comprise at least one material selected from the group consisting of: elastomeric resin, thermoset material, thermoplastic material, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

At least locally, there may be a number of further layers 103, 103B, 103C or generally features, potentially thus additionally or alternatively comprising also e.g. various components or other elements 105, provided on the film 102 and residing e.g. between the layer 104 and film 102, and/or arranged elsewhere in the structure such as on the opposite side of layer 104 (see items 108, 110 and topmost 105). These layers and other features may have varying functions, e.g. protective, aesthetic, decorative or other visual/optical function, sensing function, conductive function, insulating function, attaching or securing function, spacing function, etc. The features such as layers 103, 103B, 103C or elements 105 may each have dimensions such as thickness of their own (shown in the figure) as well as characterizing materials. Alternatively, multiple features such as layers 103, 103B, 103C could mutually have at least partially identical or similar configuration in terms of e.g. thickness or materials.

As being also alluded to above, in some embodiments the multilayer structure 100 may include a further substrate film 102B, or a common substrate film 102C could be bent, as being also shown in the figure, so as to define several layers 102A, 102B in the multilayer stack (layer 102B could be considered to be formed from an extension of substrate 102A). The different films or film layers 102A, 102B could be provided on the same and/or different sides of the layer 104. The film or film layer 102B could further host features such as graphics, conductive traces, electrically insulating features or e.g. components, optionally on the side facing the layer 104 as shown in the figure and/or on the side facing the environment or optional further layer(s) 110. The several films or film layers 102A, 102B may be optionally connected together by e.g. electrically conductive vias provided through intermediate layers such as layer 104, if not established by a single piece already.

The aforementioned features may include, for instance, at least one element (decorative feature can be also considered herein a functional feature due to associated decorative function in addition to other possible functions) selected from the group consisting of: electrical conductor, printed electrical conductor, electrical insulator, electrical conductor, electrically conductive via, electrical circuit design, contact pad, circuit trace, electrode, graphics, graphic ink layer, conductive ink layer, visual indicator, electrical element, electronic component, integrated circuit, optical element, light-emitting element, LED, OLED, light detecting element, lens, light directing element, light diffractor, light collimator, lightguide, sensor, pressure sensor, proximity sensor, switch, piezoelectric element, haptic element, electromechanical element, processing element, antenna, memory element, and communication element.

In various embodiments, the electrically conductive features may comprise at least one conductive material selected from the group consisting of: conductive ink, conductive nanoparticle ink, copper, steel, iron, tin, aluminium, silver, gold, platinum, conductive adhesive, carbon fibre, alloy, silver alloy, zinc, brass, titanium, solder, and any component thereof. The used conductive materials may be optically opaque, translucent and/or transparent at desired wavelengths, such as visible light, so as to mask or let the radiation such as visible light to be reflected therefrom, absorbed therein or let through, for instance.

One or more of the features may have been produced directly to the multilayer structure 100 or a particular constituent element, such as substrate 102, thereof utilizing e.g. printed electronics technology such as screen printing, flexography, gravure, offset lithography, or ink jetting. Alternatively or additionally, e.g. etching or applicable coating method such as silver or flow coating may have been utilized. As a further option, ready-made features may have been attached to the structure using e.g. adhesive, heat and/or pressure, optionally in the form of a selected lamination method. Yet as a further option, one or more features such as conductive traces, components, heat conducts, and/or other elements could have been provided on at least partially pre-prepared carrier such as tape (e.g. adhesive tape or specifically, adhesive transfer tape) that is then arranged onto the substrate 102 or generally, to the structure 100.

In various embodiments, one or more of the included substrate films 102, 102B, 102C, further layers 103, 103B, 103C, 108, 110 and/or further features 105 may at least partially be optically substantially opaque or at least translucent, having regard to predefined wavelengths e.g. in visible spectrum. These items may have been provided with visually distinguishable, decorative/aesthetic and/or informative, features such as graphical pattern and/or color thereon or therein. Generally, IML (in-mold labeling)/IMD (in-mold decoration) technique is applicable for manufacturing such. The items may be at least partially, i.e. at least in places, optically substantially transparent to radiation such as visible light emitted by e.g. in-structure or other electronics thereon. The transmittance may be about 75%, 80%, 85%, 90%, 95% or higher, for example.

Item 106 refers to at least one detachment-enhancing feature of the substrate film 102. The feature 106 may extend practically over the whole surface area 102A or just cover a local portion (as shown) thereof.

In some embodiments, the detachment-enhancing feature 106 of the substrate 102 comprises at least one adhesion-reducing feature. Such feature may comprise e.g. gaseous bubble or gaseous material (thus defining a space of non-solid material within the structure 100 of e.g. air, if not practically defining a void), gasifiable material, chemically or otherwise dissociable material, meltable material, thermally removable material, chemically removable material, adhesive drop or element, solid element, and/or cast assistant material, provided upon the first side 102A of the substrate film 102, preferably in contact with the surface of the substrate film 102 on the first side 102A thereof, prior to arranging further features and e.g. layer 104 upon the first side of the substrate film.

Preferably, the adhesion-reducing feature provided on the film 102 is configured to reduce the film's adhesion to the adjacent material that is intended to remain in the structure 100, such as the material of the layer 104 and/or intermediate material such as the material of layer/feature 103, 103B, if any, which may refer to a material layer (e.g. decorative/graphic ink, conductive ink, or otherwise functional ink) or e.g. component provided between the adhesion-reducing feature and layer 104 and contacting the adhesion-reducing feature.

In various embodiments, the adhesion-reducing feature may comprise low adhesion material, such as solid material, having regard to and facing the layer 104 and possible intermediate, immediately adjacent, feature 103, 103B.

In various embodiments, at least one adhesion-reducing feature may remain substantially as is (i.e. the associated material or structure stays as originally provided upon the film 102) after its provision upon the substrate film 102 and through removal of the at least portion of the film 102.

In some other, supplementary or alternative, embodiments, at least one detachment-enhancing feature 106 may comprise material that is to be additionally activated or otherwise processed to enhance its detachment properties such as adhesion-reducing properties prior to or upon the removal of the at least portion of the film 102 from the structure 100.

For example, the feature may be transformed into different state of matter or construction, optionally by thermal or chemical exposure that may be subjected specifically to the feature or multilayer structure in general. For example, heat may be applied to transform solid material into molten form (consider e.g. sugar or salt) or to gasify the material. The feature as initially provided could be thus considered as a precursor of the transformed version. In some embodiments, the material may be configured to undergo the desired transformation without a need to later trigger or execute any particular externally induced activation procedure, e.g. due to internal chemical or other process that may optionally begin immediately after provision of the material upon the substrate 102.

In various embodiments, an adhesion-reducing feature or generally, detachment-enhancing feature, may have been provided on the film 102 or adjacent layer by any suitable technology, such as at least one selected printed electronics technology, e.g. one of the listed hereinbefore, or through application of selected coating technology such as flow coating or silver coating, or using a carrier, e.g. tape, as discussed above relative to arranging of other features to the structure 100. Yet, the feature may be mounted on the film 102 and optionally secured using e.g. adhesive, heat, pressure or generally, a suitable lamination technique. In some embodiments, the feature such as gas, or specifically air, filled cavity may have been produced using e.g. a solid piece of material that has been transformed or removed from the associated space since the production, such as molding, of adjacent features such as layer 103, 103B or 104 upon the film 102.

In various embodiments, the material of at least one detachment-enhancing feature 106 may be configured to weaken or thin the material of the substrate film 102 e.g. chemically. Thus the subsequent, at least partial, removal of the film 102 may additionally or solely take place via the first side 102A thereof in addition or instead of side 102B.

In various embodiments, at least one detachment-enhancing feature 106 comprises at least one element 106B selected from the group consisting of: pre-cut portion in the (substrate) film, thinned portion in the film, thinner produced portion in the film such as thinner casted or molded portion in the film, and generally weakened portion in the film.

These and similar features, obtained e.g. by mechanical or chemical processes (carving, etching, drilling, sawing, cutting, grinding, piercing, etc.) may have been configured to locally weaken the substrate film 102 in terms of facilitated mechanical removal of said at least portion thereof e.g. along the shape defined by the features.

Switching over to embodiment 120, various features of embodiment 120 are generally considered similar to the one of embodiment 100 and are not repeated here to avoid unnecessary redundancy.

However, the embodiment 120 differs from the embodiment 100 in that at least portion of substrate 102, i.e. just a portion (shown) or basically the whole substrate 102, has been removed from the multilayer structure with the aid of one or more aforediscussed detachment-enhancing features 106. The at least portion may have been removed by activities such as peeling or pulling action executed from or via the second side 102B of the film 102 but as previously mentioned, removal activity may take additionally or alternatively take place via the first side 102A, i.e. from within or via the remaining structure.

During said removal, the adhesion-reducing feature 106, or internal material thereof, may have been removed together and possibly still connected with the portion. This may apply e.g. to solid, liquid or e.g. gelous materials whereas gases, e.g. air, or generally gaseous materials potentially present within a cavity type feature 106 may have escaped the concerned space freely.

Accordingly, the space released and typically at least partially originally defined and/or occupied by the detachment-enhancing feature 106 and/or substrate 102 has become available for different purposes, including but not limited to execution of one or more post-processing tasks, such as shaping, targeted to the exposed internals of the structure such as internal layers 103, 103B or other features 105, or to addition of one or more preferably functional features in the structure.

In the figure, a second functional feature 122 has been provided into the released space advantageously so that it least functionally, preferably electrically, electromagnetically or optically, connects with one or more of the first functional features already provided in the structure as discussed hereinearlier. The second functional feature 122 may basically include any element previously listed herein as a potential first functional feature. Additionally, it may include e.g. high power or other heat generating element such as a high-power LED, gas sensor or generally atmospheric sensor or other external condition(s) measuring sensor, or any other element the operation or installation of which optionally benefits from the location at the perimeter of the structure or provision after certain manufacturing stages such as molding or forming, as deliberated above.

The space released may have been partially or fully consumed by the provided second functional feature 122 and optional further material, or "fill". Further features such as additional layer(s) 124 may have been then provided to the structure 120 for securing, protection, aesthetic, element or component hosting, or other purposes.

As indicated in figure by dotted lines 123, the second functional feature 122 may protrude from the structure, establish an even surface therewith, or be disposed deep in the space so that a hole still remains at the perimeter of the structure unless covered by optional further feature or fill.

In various embodiments, the second functional feature 122 may have been provided by attaching it, preferably utilizing adhesive or solvent, as essential ready-made element, or by at least partially directly producing (manufacturing) it into the hole, optionally by injection molding.

In various embodiments, the second functional feature 122, such as a light source, lens or other optical or electrical feature, may have been aligned, upon installation or direct manufacturing thereof in the structure 120, with one or more of said first functional features (again e.g. optical or electrical features) or other feature provided on the first side of the substrate film.

In some embodiments, the second functional feature 122 comprises a connector such as an electrical connector or a connector cable with connectors e.g. at one or both ends. The connector may contain a body member of e.g. monolithic or composite construction. The connector such as the body member thereof may comprise e.g. electrically substantially insulating material such as selected plastics (e.g. polycarbonate, polyimide) or ceramic material. In terms of providing electrical connectivity, the connector, however, preferably comprises a number of electrically conductive contact elements, such as pins or other features optionally sticking out from the body. The contact elements may be utilized to electrically (galvanically) couple to the conductors of the cable, to an external device or structure such as host device or structure, or e.g. to a further connecting element such as another connector. Yet, they may couple to conductive features within the structure 120.

Figure 2:
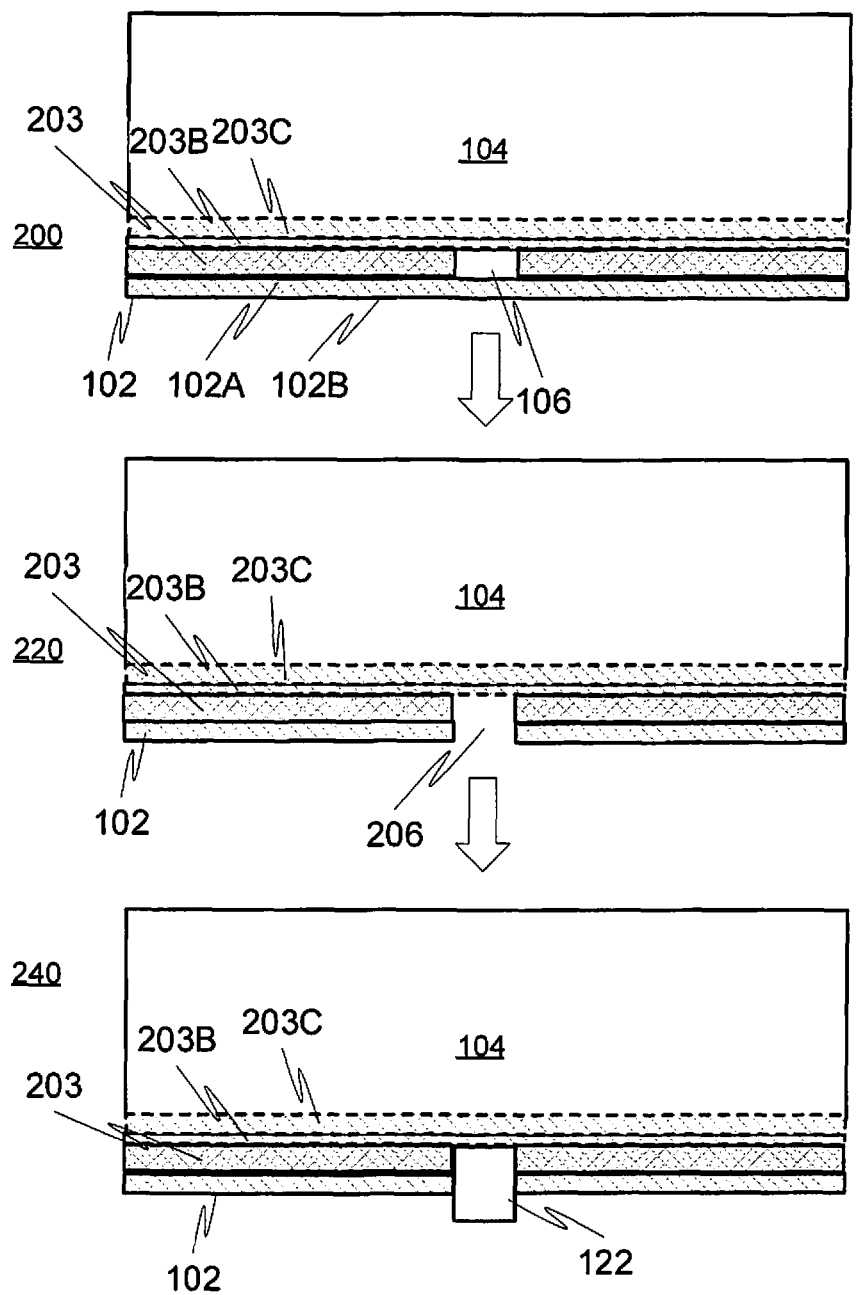
FIG. 2 illustrates, via a schematic side or cross-sectional view, one embodiment of a multilayer structure, related material removal and subsequent provision of further functional elements in accordance with the present invention in the general context of integrating functional element(s) in at least partially already-manufactured multilayer structure.

FIG. 2 illustrates, via a schematic side or cross-sectional view, a more specific embodiment of a multilayer structure, related material removal and subsequent provision of further functional elements in accordance with the present invention in the general context of integrating functional element(s) within at least partially already-manufactured multilayer structure. Considerations given in the description of FIG. 1 are still generally fully applicable here, and vice versa, what comes to e.g. used materials, dimensions, layers, and further aspects.

By the embodiment, it is possible to introduce a number of detachment-enhancing features, e.g. detachment-enhancing areas, 106 on a substrate film 102 where adhesion relative to adjacent material thereon, such as a plastic or ink layer, is lower than otherwise, whereupon the film 102 can be separated from the adjacent layer(s), or generally functional features, such as graphic print 203C or functional print 203, 203B so that the associated graphic 203C and functional 203, 203B inks remain in the structure. The film 102 can be thus removed from the selected area(s) and the remaining graphic 203C and functional ink 203, 203B be exposed to post processing, for example.

As shown at 200, one or more selected areas of the surface of the substrate film 102 are provided with the detachment-enhancing feature 106 e.g. in the form of a protective layer, preferably by printing it using e.g. a selected printed electronics technology. Material properties of the feature 106 are chosen so that it has poor adhesion to e.g. adjacent functional ink 203, 203B (and e.g. poorer than to the substrate 102), which may be further printed thereon, whereupon, as shown at 220, the substrate film 102 can be locally, i.e. substantially at the location of the feature 106, be peeled off, cut, or otherwise removed after provision, such as injection molding, of the layer 104. This exposes the functional ink layers 203, 203B remaining in the multilayer structure for further processing, for example. In case there was no layer 203B upon the location of feature 106, also graphics (ink) layer 203C provided upon the ink layer 203 could be correspondingly exposed.

As shown at 240, after removal of the film 102 functional ink layers 203, 203B can be indeed reached from outside and functionality (a functional feature such as selected material, component or other element, e.g. LED or other light source that is optionally configured to illuminate e.g. graphic ink 203C) 122 be conveniently added in the released space 206 originally occupied by the feature 106 and the removed portion of the substrate film 102.

Figure 3:
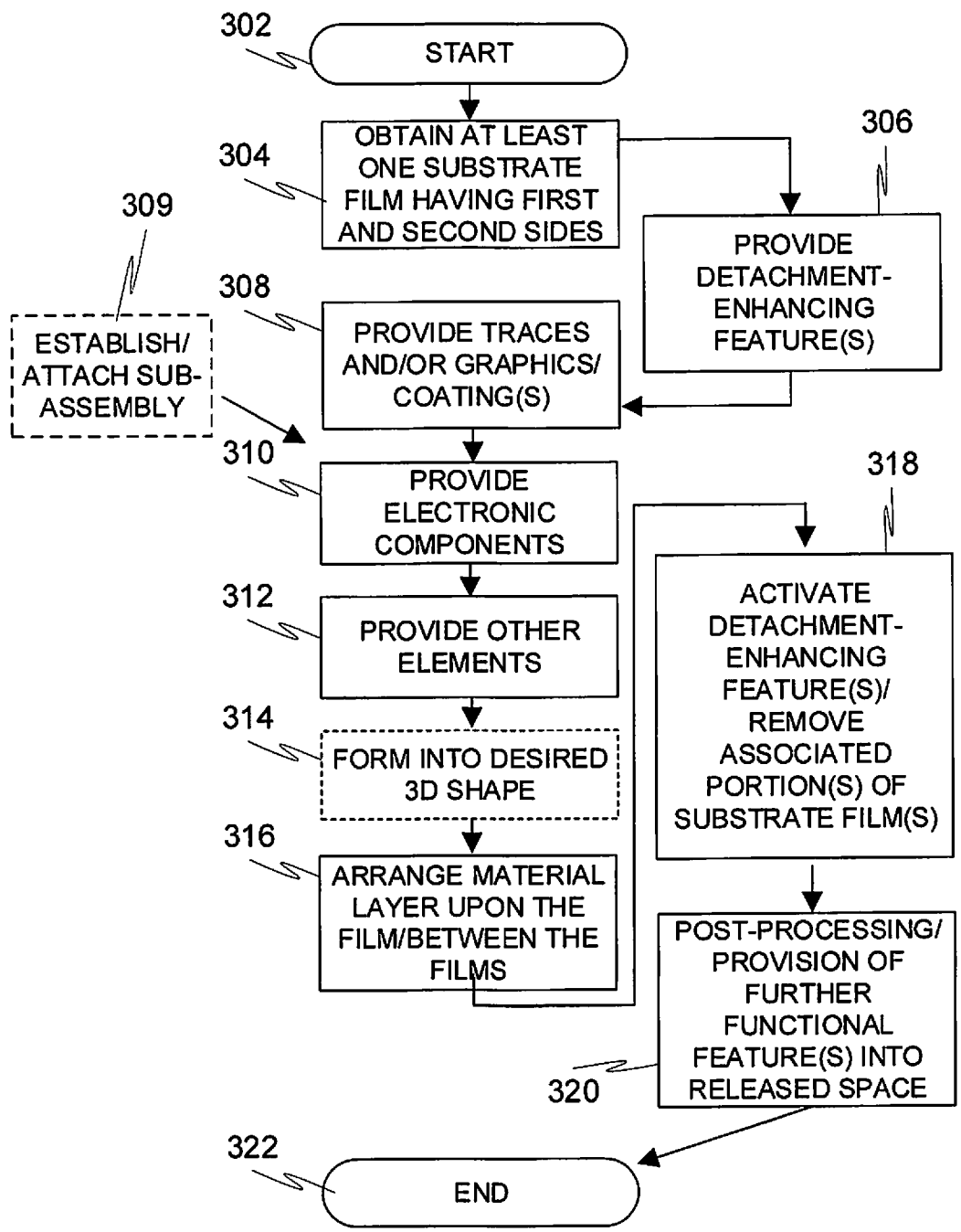
FIG. 3 is a flow diagram disclosing an embodiment of a method in accordance with the present invention.

FIG. 3 includes, at 1800, a flow diagram of an embodiment of a method in accordance with the present invention.

At the beginning of the method for manufacturing the multilayer structure, a start-up phase 302 may be executed. During start-up, the necessary tasks such as material, component and tools selection, acquisition, calibration and other configuration tasks may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding/IMD (in-mold decoration), lamination, bonding, (thermo)forming, casting, electronics assembly, peeling, cutting, drilling and/or printing equipment, among others, may be thus ramped up to operational status at this stage.

At 304, at least one, optionally flexible, substrate film of e.g. plastics or other material as discussed hereinbefore for accommodating electronics and/or other features, such as graphics, material layers, optical elements, etc. is obtained. The substrate film may initially be substantially planar or e.g. curved. A ready-made element, e.g. a roll or sheet of plastic film, may be in some embodiments acquired for use as the substrate material. In some embodiments the substrate film itself may be first produced or at least treated, optionally cut and/or coated, by molding or other methods from a number of selected starting material(s). Optionally, the substrate film may be processed further at this stage.

Items 306-314 have been disclosed separately in certain order for clarity reasons but a person skilled in the art should easily apprehend the fact that depending on each particular use scenario, the mutual order of the items may be flexibly changed, they may be executed alternately and repeatedly, integrated together or split into smaller ensembles, for example. Yet, one or more items may be selectively omitted from the implementation.

Item 306 refers to provision of one or more detachment-enhancing features such as aforesaid adhesion-reducing features and/or substrate-weakening features (pre-cut portions, thinned portions, etc.) to one or more substrate film(s). As discussed hereinbefore, in some embodiment the features may include e.g. solid materials that have either as is, or e.g. in processed or transformed form subject to heating or some other exposure, lower adhesion to materials or related elements to be located adjacent thereto than the concerned substrate film(s) as such. Additionally or alternatively, the features may include e.g. gaseous matter such as air.

Item 308 refers to provision of functional features such as conductive layers or areas defining e.g. a number of conductor lines (traces, defining e.g. at least part of a circuit design), electrodes and/or contact pads on the substrate film(s), on any or both sides thereof, preferably but not necessarily by one or more additive techniques of printed electronics technology. For example, screen, inkjet, flexographic, gravure or offset lithographic printing may be utilized. Also further actions cultivating the film(s) involving e.g. printing or generally provision of decorative or informative graphics such as visual indicators thereon may take place here. The various features provided may be superimposed on the film(s) as indicated e.g. in FIG. 2.

At 310, a number of e.g. electronic component type functional features such as ready-made components including e.g. various SMDs may be attached to the contact areas on the film(s) e.g. by solder and/or adhesives. Alternatively or additionally, e.g. printed electronics technology may be applied to actually manufacture at least part of the components, such as OLEDs, directly onto the film(s). Item 309 refers to possible provision of sub-assemblies such as system-on-a-chip assembly on the film(s).

At 312, a number of e.g. optical or other type of functional features may be provided by mounting or directly fabrication onto the substrate film(s).

At 314, 3D forming, using e.g. thermoforming or cold forming, of the substrate film(s) may take place. As outcome, the concerned substrate film(s) shall exhibit a desired three-dimensional (essentially non-planar) shape. The substrate film(s) containing suitable, formable material may therefore be shaped to better fit the target environment/device and/or to better accommodate various features. Alternatively, forming could take place prior provision of functional features on the film(s) or e.g. after molding in case the already-established multilayer stack is designed to survive such processing.

At 316, at least one material layer as contemplated hereinbefore, optionally comprising e.g. thermoplastic material, is arranged upon the substrate film(s) so as to cover e.g. one or more (first) functional features already provided thereon. As mentioned earlier, e.g. molding, casting or further selected lamination techniques are generally applicable here.

In practice, one or more substrate films may be used as an insert in an injection molding process, for instance. One side of the substrate film may be, at least in some embodiments, left free from the molded plastics.

In case two films are used, both of them may be inserted in their own mold halves so that the plastic layer is injected between them. Alternatively, the second film could be attached to an aggregate of the first film and plastic layer afterwards by suitable lamination technique.

Regarding the resulting overall thickness of the obtained stacked multilayer structure, it depends e.g. on the used materials and related minimum material thicknesses providing the necessary strength in view of the manufacturing and subsequent use.

These aspects have to be considered on case-by-case basis. For example, the overall thickness of the structure could be about 1 mm or a few millimetres, but considerably thicker or thinner embodiments are also feasible.

Item 318 refers to removal of at least portion of at least one substrate film provided with at least one detachment-enhancing feature, which will reveal space within the structure originally occupied by the at least one feature and the at least portion of the concerned film. The at least one detachment-enhancing feature may leave the structure together with the (portion of) the film, optionally still attached thereto. In some embodiments, the feature may have to be additionally transformed, or it may transform (molten, vaporized, etc.), into e.g. different state of matter such as gaseous matter, as contemplated hereinbefore, to enhance its adhesion-reducing properties and/or removal.

Item 320 refers to provision of one or more (second) functional features, such as various materials, components and/or connectors, in the structure, i.e. in the space(s) such as holes revealed by the at least one detachment-enhancing feature and substrate film(s). Further, various post-processing tasks may be executed at this stage e.g. to the exposed internals of the structure. Additional layers may be provided to the multilayer structure by lamination or e.g. suitable coating (e.g. deposition) procedure. The layers may be of protective, indicative and/or aesthetic value (graphics, colors, figures, text, numeric data, etc.) and contain e.g. textile, leather or rubber materials instead of or in addition to plastics. Additional elements such as electronics may be installed at the outer surface(s) of the structure, such as the exterior surface of the substrate. The provided connector or connector cable type feature may be connected to a desired external connecting element such as external connector or connector cable of an external device, system or structure.

At 322, method execution is ended.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario.

The invention claimed is:

1. A method for manufacturing an integrated multilayer structure, comprising:
    obtaining a flexible substrate film of selected thermoplastic material, the substrate film having a first side and a second side opposite the first side;
    printing at least one functional ink layer onto an outer surface of the first side of the substrate film;
    providing one or more first functional features on at least the first side of the substrate film;
    arranging at least one layer at least partially comprising electrically substantially insulating or conductive material upon the at least one functional ink layer, wherein the multilayer structure defines an enclosed space in the multilayer structure, wherein the enclosed spaced is at least partially filled with a detachment-enhancing feature including at least one of a meltable material, a chemically dissociable material, a thermally removable material, or a chemically removable material;
    forming at least one of the substrate film or the at least one layer into a non-planar, three-dimensional shape;
    at least one of melting, chemically dissociating, thermally removing, or chemically removing the detachment-enhancing feature from the space, thereby chemically thinning, weakening, or removing at least a portion of the substrate film, wherein the detachment-enhancing feature is disposed adjacent the outer surface of the first side of the substrate film; and
    providing at least one second functional feature into the space so that the at least one second functional feature at least functionally connects with at least one of the one or more first functional features, the at least one second functional feature protruding from the substrate film.

2. The method of claim 1, wherein the arranging comprises molding at least portion of at least one material of the at least one layer onto the first side of the substrate film.

3. The method of claim 1, wherein the arranging comprises laminating at least a portion of the at least one layer that is ready-made onto the first side of the film utilizing mechanical bonding, chemical bonding, electrical bonding, electrical bonding, heat, pressure, solvent or adhesive.

4. The method of claim 1, wherein the at least one second functional feature comprises at least one element selected from the group consisting of: electrical element, electronic component, optical element, light-emitting element, light-detecting element, LED, high power element, high power LED, lens, sensor, pressure sensor, proximity sensor, electrode, switch, piezoelectric element, piezoelectric haptic element, haptic element, electromechanical element, processing element, memory element, communication element, micromechanical element, integrated circuit, antenna, gas sensor, atmospheric sensor, external conditions sensor, and connector.

5. The method of claim 1, wherein at least one of the one or more first functional features is printed by printed electronics technology.

6. The method of claim 1, wherein the one or more first functional features include at least two stacked features.

7. The method of claim 1, wherein the space is filled completely or by the provided at least one second functional feature.

8. The method of claim 1, wherein at least one feature of the at least one second functional feature is provided by at least partially directly producing it into the space.

9. The method of claim 1, wherein at least one feature of the at least one second functional feature is aligned with one or more of the first functional features or other feature provided in the structure.

10. The method of claim 1, comprising arranging a further film or film layer on the at least one layer, where the at least one layer is arranged through molding material of the at least one layer between the substrate film and the further film or extension of the substrate film.

11. The method of claim 1, wherein the one or more first functional features includes at least one mounted electronic component, the method further comprising mounting the at least one mounted electronic component to the substrate film prior to forming the substrate film into the non-planar, three-dimensional shape.

12. The method of claim 1, wherein the substrate film is formed into the non-planar, three-dimensional shape before the at least one layer is arranged upon the at least one functional ink layer.

* * * * *